United States Patent
Bliss et al.

(10) Patent No.: US 6,753,797 B2
(45) Date of Patent: Jun. 22, 2004

(54) MULTIPROPERTY 16/17 TRELLIS CODE

(75) Inventors: William G. Bliss, Thornton, CO (US); Razmik Karabed, San Jose, CA (US)

(73) Assignee: Infineon Technologies AG, Munich (DE)

( * ) Notice: Subject to any disclaimer, the term of this patent is extended or adjusted under 35 U.S.C. 154(b) by 39 days.

(21) Appl. No.: 10/253,993

(22) Filed: Sep. 25, 2002

(65) Prior Publication Data

US 2004/0056784 A1 Mar. 25, 2004

(51) Int. Cl.$^7$ .............................................. H03M 7/00
(52) U.S. Cl. ....................................................... 341/59
(58) Field of Search ........................... 341/59, 118, 120, 341/143

(56) References Cited

U.S. PATENT DOCUMENTS 6,081,210 A * 6/2000 Nikolic et al. ............... 341/59

* cited by examiner

Primary Examiner—Brian Young

(57) ABSTRACT

A coding system that in a first embodiment is capable of encoding 16-bit input words into even parity 17-bit codewords, wherein the codewords have at least 7 ones, wherein the codewords has an 8-bit first half and a 9-bit second half, wherein the first half has at least 3 or more ones, and wherein the second half comprises at least 3 or more ones. The first half and second half of the codewords each have odd-coordinate bits and even-coordinate bits, at least one odd-coordinate bit of each half has a value of one, and at least one even-coordinate bit of each half has a value of one. In a second embodiment, the coding system is capable of encoding 16-bit input words into even parity 17-bit codewords, wherein the codewords have at least 7 ones, wherein the codewords have an 11-bit first half and a 6-bit second half, wherein the first half comprises at least 3 or more ones, and wherein the second half has at least 2 or more ones. The last half of the codewords have odd-coordinate bits and even-coordinate bits, and wherein at least one odd-coordinate bit of the last half has a value of one, and at least one even-coordinate bit of the last half has a value of one.

31 Claims, 25 Drawing Sheets

PARTITIONS OF INPUT SPACE OF H' CODE

Define Input:
x'=(x1 x2 x3 x4 x5 x6 x7 x8)
x"=(x9 x10 x11 x12 x13 x14 x15 x16)
x= (x' x")

Operations:
(~, &, |, W(x)) = (Complement, AND, OR, number of ones in x)

Partition of input space {x}

| Set Name | Members of Set |
|---|---|
| S1 | {x: W(x') ≥ 3 & W(x") ≥ 3 & W(x) ≥7} |
| S2 | {x: W(x') = 3 & W(x") = 3} |
| S3 | {x: W(x') ≥ 3 & W(x") < 3} |
| S4 | {x: W(x') < 3 & W(x") ≥ 3} |
| S5 | {x: W(x') < 3 & W(x") < 3} |
| B1 | {x: (x1 x3 x5 x7) ≠(0000)} |
| B2 | {x: (x2 x4 x6 x8) ≠(0000)} |
| B3 | {x: (x9 x11 x13 x15)≠(0000)} |
| B4 | {x: (x10 x12 x14 x16)≠(0000)} |

Pair-wise disjoint sets (R1 ... R10)

| Set Name | Members of Set |
|---|---|
| R1 | S1 ∩ (B1 ∩ B2) ∩ (B3 ∩ B4) |
| R2 | S1 ∩ (~(B1 ∩ B2)) ∩ (B3 ∩ B4)) |
| R3 | S1 ∩ (B1 ∩ B2) ∩ (~(B3 ∩ B4)) |
| R4 | S1 ∩ (~(B1 ∩ B2)) ∩ (~(B3 ∩ B4)) |
| R5 | S2 |
| R6 | S3 ∩ B2 |
| R7 | S3 ∩ (~B2) |
| R8 | S4 ∩ B4 |
| R9 | S4 ∩ (~B4) |
| R10 | S5 |

FIG. 4

MAP F2

Define sets

| Set | Members |
|---|---|
| t0 | (0 0 0 0 0 0 0 0) |
| T1 | (0 0 1 0 0 0 0 0),(0 0 0 1 0 0 0 0),(0 0 0 0 1 0 0 0),<br>(0 0 0 0 0 1 0 0),(0 0 0 0 0 0 1 0),(0 0 0 0 0 0 0 1) |
| t1 | (1 0 0 0 0 0 0 0) |
| t2 | (0 1 0 0 0 0 0 0) |
| T2 | (1 1 0 0 0 0 0 0),(1 0 1 0 0 0 0 0),(1 0 0 1 0 0 0 0),<br>(1 1 0 0 0 1 0 0),(1 0 0 0 0 0 1 0),<br>(1 0 0 0 0 0 0 1) |
| T | {0,1}^8 - t0 - T1 - t1 - t2 - T2 |

230

F2 (x=(x1 x2 x3 x4 x5 x6 x7 x8)) → y=(y1 y2 y3 y4 y5 y6)

| x | y |
|---|---|
| if x=t0 | ( 1 1 0 0 1 1 ) |
| if x=t1 | ( 1 1 0 1 0 1 ) |
| if x=t2 | ( 1 1 0 1 0 0 ) |
| if x=T2 | (~v1 ~v2 ~v3 ~v4 ~v5 ~v6) |
| if x=T U T1 | ( v1 v2 v3 v4 v5 v6) |

240 v1= g5|g6|g7|g8    v2=g3|g4|g7|g8    v3=g2|g4|g6|g8    v4=h1|h2|h3|h4    v5=h1|h2|h5|h6    v6=h1|h3|h5|h7

WHERE
g1= x1;
g2=~x1 & x2
g3=~x1 & ~x2 & x3
g4=~x1 & ~x2 & ~x3 & x4
g5=~x1 & ~x2 & ~x3 & ~x4 & x5
g6=~x1 & ~x2 & ~x3 & ~x4 & ~x5 & x6
g7=~x1 & ~x2 & ~x3 & ~x4 & ~x5 & ~x6 & x7
g8=~x1 & ~x2 & ~x3 & ~x4 & ~x5 & ~x6 & ~x7 & x8
h1= x8;
h2=~x8 & x7
h3=~x8 & ~x7 & x6
h4=~x8 & ~x7 & ~x6 & x5
h5=~x8 & ~x7 & ~x6 & ~x5 & x4
h6=~x8 & ~x7 & ~x6 & ~x5 & ~x4 & x3
h7=~x8 & ~x7 & ~x6 & ~x5 & ~x4 & ~x3 & x2
h8=~x8 & ~x7 & ~x6 & ~x5 & ~x4 & ~x3 & ~x2 & x1

FIG. 6

MAP F2I

F2I ( y=(y1 y2 y3 y4 y5 y6) ) ⟶ x=(x1 x2 x3 x4 x5 x6 x7 x8)

| y | x |
|---|---|
| (1 1 0 0 1 1) | (0 0 0 0 0 0 0 0) |
| (1 1 0 1 0 1) | (1 0 0 0 0 0 0 0) |
| (1 1 0 1 0 0) | (0 1 0 0 0 0 0 0) |
| (1 1 1 p1 p2 p3) & (p1 p2 p3)≠(111) | (r1 r2 r3 r4 r5 r6 r7 r8) |
| anything other than the above | (w1 w2 w3 w4 w5 w6 w7 w8) |

FIG. 7

WHERE
r1= 1
r2= p1 & p2 & p3         r3= p1 & -p2 & p3       r4= p1 & -p2 & -p3
r5=-p1 & p2 & p3         r6=-p1 & p2 & -p3       r7=-p1 & -p2 & p3       r8=-p1 & -p2 & -p3

AND WHERE
w1=v1|u1    w2=v2|u2    w3=v3|u3    w4=v4|u4
w5=v5|u5    w6=v6|u6    w7=v7|u7    w8=v8|u8 v1=-y1 & -y2 & -y3       v2=-y1 & -y2 & y3        v3=-y1 & y2 & -y3       v4=-y1 & y2 & y3
v5= y1 & -y2 & -y3       v6= y1 & -y2 & y3        v7= y1 & y2 & -y3       v8= y1 & y2 & y3 u1=-y4 & -y5 & -y6       u2=-y4 & -y5 & y6        u3=-y4 & y5 & -y6       u4=-y4 & y5 & y6
u5= y4 & -y5 & -y6       u6= y4 & -y5 & y6        u7= y4 & y5 & -y6       u8= y4 & y5 & y6

MAP F4 — 250

F4(x=(x1 x2 x3 x4 x5 x6 x7 x8)) → y=(y1 y2 y3 y4 y5)

| x | y | | | | |
|---|---|---|---|---|---|
|  | y1 | y2 | y3 | y4 | y5 |
| (x1 x2 x3 x4 x5 x6 x7 x8) | x1&x3&x5&(~x7) | x1&x3&(~x5)&x7 | x1&(~x3)&x5&x7 | (~x1)&x3&x5&x7 | x1&x3&x5&x7 |

MAP F4I — 260

F4I(y=(y1 y2 y3 y4 y5)) → x=(x1 x2 x3 x4 x5 x6 x7 x8)

| y | x | | | | | | | |
|---|---|---|---|---|---|---|---|---|
|  | x1 | x2 | x3 | x4 | x5 | x6 | x7 | x8 |
| (y1 y2 y3 y4 y5) | y1|y2|y3|y5 | 0 | y1|y2|y4|y5 | 0 | y1|y3|y4|y5 | 0 | y2|y3|y4|y5 | 0 |

FIG. 9

H' ENCODER MAP

H' (x=(x1 ... x16)) → y=(y1 ... y17)

| if x is in | y1 | y2 | y3 | y4 | y5 | y6 | y7 | y8 | y9 | y10 | y11 | y12 | y13 | y14 | y15 | y16 | y17 |
|---|---|---|---|---|---|---|---|---|---|---|---|---|---|---|---|---|---|
| | | | | H1' | | | | | | | | | H2' | | | | |
| R1 | x1 | x2 | x3 | x4 | x5 | x6 | x7 | x8 | x9 | x10 | x11 | x12 | x13 | x14 | x15 | x16 | 0 |
| R2 | 0 | 0 | 1 | 0 | x5 | x6 | x7 | x8 | x9 | x10 | x11 | x12 | x13 | x14 | x15 | x16 | 1 |
| R3 | 0 | 0 | 0 | 1 | a1' | a2' | a3' | a4' | x1 | x2 | x3 | x4 | x5 | x6 | x7 | x8 | 1 |
| R4 | 0 | 0 | 0 | 0 | a1" | a2" | a3" | a4" | a1' | a2' | a3' | a4' | a1" | a2" | a3" | a4" | 1 |
| R5 | 1 | 1 | b1' | b2' | b3' | b4' | b5' | b6' | b7' | b1" | b2" | b3" | b4" | b5" | b6" | b7" | 1 |
| R6 | 0 | 1 | h1" | h4" | h2" | h5" | h3" | h6" | x1 | x2 | x3 | x4 | x5 | x6 | x7 | x8 | 1 |
| R7 | 1 | 1 | 1 | g1' | g2' | g3' | g4' | g5' | 0 | 1 | h4' | h1' | h5' | h2' | h6' | x8 | 1 |
| R8 | 1 | 0 | h4' | h1' | h5' | h2' | h6' | h3' | x9 | x10 | x11 | x12 | x13 | x14 | x15 | x16 | 1 |
| R9 | 1 | 1 | 1 | g1" | g2" | g3" | g4" | g5" | 1 | 0 | h4" | h1" | h5" | h2" | h6" | h3' | 1 |
| R10 | 0 | 0 | 1 | 1 | h4" | h1" | h5" | h2" | h6" | h3" | h4" | h1" | h5" | h2" | h6" | h3" | 1 |

Where (a1' a2' a3' a4')    = F3E(x1 x2 x3 x4 x5 x6 x7 x8);
(a1" a2" a3" a4")    = F30(x9 x10 x11 x12 x13 x14 x15 x16);

H' DECODER MAP

DECODER (y=(y1 y2 ... y17)) → x=(x1 x2 ... x16))

| | | x1 | x2 | x3 | x4 | x5 | x6 | x7 | x8 | x9 | x10 | x11 | x12 | x13 | x14 | x15 | x16 |
|---|---|---|---|---|---|---|---|---|---|---|---|---|---|---|---|---|---|
| 1 | y17=0 | y1 | y2 | y3 | y4 | y5 | y6 | y7 | y8 | y9 | y10 | y11 | y12 | y13 | y14 | y15 | y16 |
| 2 | y17=1 & y1y2y3y4=0010 | A1' | A2' | A3' | A4' | A5' | A6' | A7' | A8' | y9 | y10 | y11 | y12 | y13 | y14 | y15 | y16 |
| 3 | y17=1 & y1y2y3y4=0001 | y9 | y10 | y11 | y12 | y13 | y14 | y15 | y16 | A1" | A2" | A3" | A4" | A5" | A6" | A7" | A8" |
| 4 | y17=1 & y1y2y3y4=0000 | B1' | B2' | B3' | B4' | B5' | B6' | B7' | B8' | B1" | B2" | B3" | B4" | B5" | B6" | B7" | B8" |
| 5 | y17=1 & y1y2=11 & weight(y4 ... y8)>1 | C1' | C2' | C3' | C4' | C5' | C6' | C7' | C8' | C1" | C2" | C3" | C4" | C5" | C6" | C7" | C8" |
| 6 | y17=1 & y1y2=01 | y9 | y10 | y11 | y12 | y13 | y14 | y15 | y16 | D1" | D2" | D3" | D4" | D5" | D6" | D7" | D8" |
| 7 | y17=1 & y1y2=11 & weight(y4 ... y8)=1 & y9y10=01 | E1 | E2 | E3 | E4 | E5 | E6 | E7 | E8 | y9 | y10 | y11 | y12 | y13 | y14 | y15 | y16 |
| 8 | y17=1 & y1y2=10 | D1' | D2' | D3' | D4' | D5' | D6' | D7' | D8' | E1 | E2 | E3 | E4 | E5 | E6 | E7 | E8 |
| 9 | y17=1 & y1y2=11 & weight(y4 ... y8)=1 & y9y10=10 | F1 | F2 | F3 | F4 | F5 | F6 | F7 | F8 | F1 | F2 | F3 | F4 | F5 | F6 | F7 | F8 |
| 10 | y17=1 & y1y2y3y4=0011 | G1 | G2 | G3 | G4 | G5 | G6 | G7 | G8 | | | | | | | | |

WHERE

PARTITION FOR INPUT SPACE OF H" CODE

Define Input x:
x'=(x1 x2 x3 x4 x5 x6 x7 x8 x9 x10)
x"=(x11 x12 x13 x14 x15 x16)
x= (x' x")

Operations:
(~, &, |, ⊕, +, W(x)) = (Complement, AND, OR, XOR, addition over integers, number of ones in x)

Partition of input space {x} — 340

| Set Name | Members of Set |
|---|---|
| T1 | {x: W(x') ≥ 3 & W(x") ≥ 2} |
| T2 | {x: W(x') ≥ 3 & W(x") < 2} |
| T3 | {x: W(x') < 3 & W(x") ≥ 2} |
| T4 | {x: W(x') < 3 & W(x") < 2} |
| T5 | {x: W(x1 x2 x3 x4) = 0} |
| T6 | {x: W(x1 x2 x3 x4) = 1} |
| T7 | {x: W(x1 x2 x3 x4) = 2 & W(x5 x6 x7 x8) = 1 } |
| T8 | {x: W(x1 x2 x3 x4) = 2 & W(x5 x6 x7 x8) = 0 } |
| T9 | {x: W(x1 x2 x3 x4) = 3} |
| T10 | {x: W(x) ≥ 6} |
| B1 | {x: (x11 x13 x15) ≠ (000)} |
| B2 | {x: (x12 x14 x16) ≠ (000)} |

Pair-wise disjoint sets (R1 ... R74) — 342

| Set Name | Members of Set |
|---|---|
| R1 | T1 ∩ (B1 ∩ B2) ∩ T10 |
| R2 | T1 ∩ (~(B1 ∩ B2)) |
| R3 | T2 |
| R4 | T3 ∩ (B1 ∩ B2) |
| R5 | T3 ∩ (~(B1 ∩ B2)) |
| R6 | T4 |
| R71 | T1 ∩ (B1 ∩ B2) ∩ (~T10) ∩ T5 |
| R72 | T1 ∩ (B1 ∩ B2) ∩ (~T10) ∩ T6 |
| R731 | T1 ∩ (B1 ∩ B2) ∩ (~T10) ∩ T7 |
| R732 | T1 ∩ (B1 ∩ B2) ∩ (~T10) ∩ T8 |
| R74 | T1 ∩ (B1 ∩ B2) ∩ (~T10) ∩ T9 |

FIG. 14

MAP F1

Let
r3=x1;      r4=x2;      r5=x3;      r6=x4;      r7=x5;      r8=x6;
H7= ( r3) & (~r5) & ( r7) & (~r4) & (~r6) & (~r8);
B1= (((~r3) & (~r5) & (~r7)) & (( r4) | ( r6) | ( r8))) | H7;
B2= (r3 | r4) & (~H7);
B3= (r5 | r6) & (~H7);
B4= (r7 | r8) & (~H7);

F1(x=(x1 x2 x3 x4 x5 x6)) → y=(y1 y2 y3 y4 y5)

| B1+B2+B3+B4 | y |
|---|---|
| > 1 | (1 B1 B2 B3 B4) |
| <= 1 | ~(1 B1 B2 B3 B4) |

MAP F1I

Let B=(B(1) B(2) B(3) B(4)) be defined as
B= [y2 y3 y4 y5]   if y1=1, and
B=~[y2 y3 y4 y5]   if y1=0, F1I(y=(y1 y2 y3 y4 y5)) → x=(x1 x2 x3 x4 x5 x6)

| conditions | x |
|---|---|
| if B(1)=0 | (B(2) 0 B(3) 0 B(4) 0) |
| if B(1)==1 & (B(2) | B(3) | B(4)) ~=0 | (0 B(2) 0 B(3) 0 B(4)) |
| if B(1)==1 & (B(2) | B(3) | B(4)) =0 | (1 0 0 0 1 0) |

FIG. 15

MAP F2

F2(x=(x1 x2 x3 x4 x5 x6 x7 x8 x9 x10)) → y=(y1 y2 y3 y4 y5 y6 y7 y8)

Let:
l1=x1; l2=x2; l3=x3; l4=x4; l5=x5;
l6=x6; l7=x7; l8=x8; r1=x9; r2=x10;

```
E11 = (~l1) & (~l2) & (~l3) & (~l4) & (~l5) & (~l6) & (~l7) & (~l8) & (~r1) & (~r2);
E10 = (~l1) & (~l2) & (~l3) & (~l4) & (~l5) & (~l6) & (~l7) & (~l8) & (~r1) & ( r2);
E9  = (~l1) & (~l2) & (~l3) & (~l4) & (~l5) & (~l6) & (~l7) & (~l8) & ( r1);
E8  = (~l1) & (~l2) & (~l3) & (~l4) & (~l5) & (~l6) & (~l7) & ( l8);
E7  = (~l1) & (~l2) & (~l3) & (~l4) & (~l5) & (~l6) & ( l7);
E6  = (~l1) & (~l2) & (~l3) & (~l4) & (~l5) & ( l6);
E5  = (~l1) & (~l2) & (~l3) & (~l4) & ( l5);
E4  = (~l1) & (~l2) & (~l3) & ( l4);
E3  = (~l1) & (~l2) & ( l3);
E2  = (~l1) & ( l2);
E1  = ( l1);

P1= E4  | E5 | E6 | E7 | E8 | E9 | E10 | E11;
P2= E2  | E3 | E7 | E8 | E9 | E10| E11;
P3= E1  | E2 | E3 | E5 | E6 | E9 | E10;
P4= E1  | E3 | E4 | E6 | E8 | E10;

G11 = (~l1) & (~l2) & (~l3) & (~l4) & (~l5) & (~l6) & (~l7) & (~l8) & (~r1) & (~r2);
G1  = ( l1) & (~l2) & (~l3) & (~l4) & (~l5) & (~l6) & (~l7) & (~l8) & (~r1) & (~r2);
G2  =        ( l2) & (~l3) & (~l4) & (~l5) & (~l6) & (~l7) & (~l8) & (~r1) & (~r2);
G3  =               ( l3) & (~l4) & (~l5) & (~l6) & (~l7) & (~l8) & (~r1) & (~r2);
G4  =                      ( l4) & (~l5) & (~l6) & (~l7) & (~l8) & (~r1) & (~r2);
G5  =                             ( l5) & (~l6) & (~l7) & (~l8) & (~r1) & (~r2);
G6  =                                    ( l6) & (~l7) & (~l8) & (~r1) & (~r2);
G7  =                                           ( l7) & (~l8) & (~r1) & (~r2);
G8  =                                                  ( l8) & (~r1) & (~r2);
G9  =                                                         ( r1) & (~r2);
G10 =                                                                ( r2);

Q1= G4 | G5 | G6 | G7 | G8 | G9 | G10 ;
Q2= G2 | G3 | G7 | G8 | G9 | G10;
Q3= G1 | G2 | G3 | G5 | G6 | G9 | G10 | G11;
Q4= G1 | G3 | G4 | G6 | G8 | G10| G11;
```

Now, y=[P1 P2 P3 P4 Q1 Q2 Q3 Q4];

FIG. 16

MAP F21

F2I(y=(y1 y2 y3 y4 y5 y6 y7 y8)) ⟶ (x1 x2 x3 x4 x5 x6 x7 x8 x9 x10)

Let

MAP F3

F3(x=(x1 x2 x3 x4 x5 x6)) → y=(y1 y2 y3 y4)

Let r3=x1;   r4=x2;   r5=x3;   r6=x4;   r7=x5;   r8=x6;

H2=r5 & r6;
H3=r7 & r8;

H4= H2 | H3;

w1=     r3 | r5;
w2=    (r3 | r7)  ⊕  H4;
w3=    (r4 | r6)  ⊕  H4;
w4=     r4 | r8;

Now, y=[w1 w2 w3 w4].

MAP F3I

F3I (y=(y1 y2 y3 y4)) → x=(x1 x2 x3 x4 x5 x6)

Let w1 = y1;   w2 = y2;   w3 = y3;   w4 = y4;

H5= w2 ⊕ [((~w1)&(~w2)&( w3)&( w4))|(( w1)&( w2)&(~w3)&(~w4))] ;
H6= w3 ⊕ [((~w1)&(~w2)&( w3)&( w4))|(( w1)&( w2)&(~w3)&(~w4))] ;

z1=  w1 &    H5;
z3=  w1 &   (~H5);
z5=(~w1) &   H5;

z2=  w4 &    H6;
z4=(~w4) &   H6;
z6=  w4 &   (~H6);

Now, x=[z1 z2 z3 z4 z5 z6].

FIG. 18

H" ENCODER MAP

ENCODER(x=(l1 l2 l3 l4 l5 l6 l7 l8 r1 r2 r3 r4 r5 r6 r7 r8)) →
y= (c1 c2 c3 c4 c5 c6 c7 c8 c9 c10 c11 c12 c13 c14 c15 c16 c17).

|   | if x is in | c1 | c2 | c3 | c4 | c5 | c6 | c7 | c8 | c9 | c10 | c11 | c12 | c13 | c14 | c15 | c16 | c17 |
|---|---|---|---|---|---|---|---|---|---|---|---|---|---|---|---|---|---|---|
| | | \multicolumn{8}{c}{H1"} | | | | \multicolumn{6}{c}{H2"} | |
| 1 | R1 | l1 | l2 | l3 | l4 | l5 | l6 | l7 | l8 | 1 | r1 | r2 | r3 | r4 | r5 | r6 | r7 | r8 |
| 2 | R2 or R3 | l1 | l2 | l3 | l4 | l5 | l6 | l7 | l8 | 0 | 1 | r1 | r2 | u1 | u2 | u3 | u4 | u5 |
| 3 | R4 | P1 | P2 | P3 | P4 | Q1 | Q2 | Q3 | Q4 | 0 | 0 | 1 | r3 | r4 | r5 | r6 | r7 | r8 |
| 4 | R5 or R6 | P1 | P2 | P3 | P4 | Q1 | Q2 | Q3 | Q4 | 0 | 0 | 0 | 1 | u1 | u2 | u3 | u4 | u5 |
| 5 | R71 | 1 | 1 | 1 | 1 | l5 | l6 | l7 | l8 | 0 | 0 | 0 | r1 | r2 | w1 | w2 | w3 | w4 |
| 6 | R72 | l1 | l2 | l3 | l4 | -l5 | -l6 | -l7 | -l8 | 0 | 0 | 0 | -r1 | -r2 | w1 | w2 | w3 | w4 |
| 7 | R731 or R74 | 1 | 1 | 1 | 1 | l5 | l6 | l7 | l8 | 0 | 0 | 0 | 1 | 1 | w1 | w2 | w3 | w4 |
| 8 | R732 | 1 | 1 | 1 | 0 | l1 | l2 | l3 | l4 | 0 | 0 | 0 | r1 | r2 | w1 | w2 | w3 | w4 |

WHERE (u1 u2 u3 u4 u5) = F1((r3 r4 r5 r6 r7 r8)),
(P1 P2 P3 P4 Q1 Q2 Q3 Q4) = F2((l1 l2 l3 l4 l5 l6 l7 l8 r1 r2)), and
(w1 w2 w3 w4) = F3((r3 r4 r5 r6 r7 r8)).

FIG. 19

H" DECODER MAP

DECODER(y=(c1 c2 c3 c4 c5 c6 c7 c8 c9 c10 c11 c12 c13 c14 c15 c16 c17)) → 360
x=(l1 l2 l3 l4 l5 l6 l7 l8 r1 r2 r3 r4 r5 r6 r7 r8).

| | If | l1 | l2 | l3 | l4 | l5 | l6 | l7 | l8 | r1 | r2 | r3 | r4 | r5 | r6 | r7 | r8 |
|---|---|---|---|---|---|---|---|---|---|---|---|---|---|---|---|---|---|
| 1 | $c_9 = 1$ | c1 | c2 | c3 | c4 | c5 | c6 | c7 | c8 | c10 | c11 | c12 | c13 | c14 | c15 | c16 | c17 |
| 2 | $c_9c_{10} = 01$ | c1 | c2 | c3 | c4 | c5 | c6 | c7 | c8 | c11 | c12 | v1 | v2 | v3 | v4 | v5 | v6 |
| 3 | $c_9c_{10}c_{11} = 001$ | s1 | s2 | s3 | s4 | s5 | s6 | s7 | s8 | s9 | s10 | c12 | c13 | c14 | c15 | c16 | c17 |
| 4 | $c_9c_{10}c_{11} = 000 \& w(m) \geq 2 \& w(n) \geq 2 \& G = 0$, OR $c_9c_{10}c_{11} = 000 \& w(m) \geq 2 \& w(n) \geq 2 \& G = 1 \& w(m) = 2$ | s1 | s2 | s3 | s4 | s5 | s6 | s7 | s8 | s9 | s10 | v1 | v2 | v3 | v4 | v5 | v6 |
| 5 | $c_9c_{10}c_{11} = 000 \& w(m) \geq 2 \& w(n) < 2 \& G = 1 \& w(m) = 4$ OR $c_9c_{10}c_{11} = 000 \& w(m) \geq 2 \& w(n) \geq 2 \& G = 1 \& w(m) = 4$ | 0 | 0 | 0 | 0 | c5 | c6 | c7 | c8 | c12 | c13 | z1 | z2 | z3 | z4 | z5 | z6 |
| 6 | $c_9c_{10}c_{11} = 000 \& w(m) < 2$ | c1 | c2 | c3 | c4 | -c5 | -c6 | -c7 | -c8 | -c12 | -c13 | z1 | z2 | z3 | z4 | z5 | z6 |
| 7 | $c_9c_{10}c_{11} = 000 \& w(m) \geq 2 \& w(n) < 2 \& G = 0$, OR $c_9c_{10}c_{11} = 000 \& w(m) \geq 2 \& 2 \leq w(m) \leq 3$ | c1 | c2 | c3 | c4 | c5 | c6 | c7 | c8 | 0 | 0 | z1 | z2 | z3 | z4 | z5 | z6 |
| 8 | $c_9c_{10}c_{11} = 000 \& w(m) \geq 2 \& w(m) = 3$ | c5 | c6 | c7 | c8 | 0 | 0 | 0 | 0 | c12 | c13 | z1 | z2 | z3 | z4 | z5 | z6 |

362

WHERE $m = (c_1\ c_2\ c_3\ c_4)$,
$n = (c_5\ c_6\ c_7\ c_8)$,
$G = 0$ if $8c_1 + 4c_2 + 2c_3 + c_4 \leq 8c_5 + 4c_6 + 2c_7 + c_8$,
$G = 1$ if $8c_1 + 4c_2 + 2c_3 + c_4 > 8c_5 + 4c_6 + 2c_7 + c_8$, $(v_1\ v_2\ v_3\ v_4\ v_5\ v_6)\ \ \ = F1I((c_{13}\ c_{14}\ c_{15}\ c_{16}\ c_{17}))$,
$(s_1\ s_2\ s_3\ s_4\ s_5\ s_6\ s_7\ s_8\ s_9\ s_{10}) = F2I((c_1\ c_2\ c_3\ c_4\ c_5\ c_6\ c_7\ c_8))$, and
$(z_1\ z_2\ z_3\ z_4\ z_5\ z_6) = F3I((c_{14}\ c_{15}\ c_{16}\ c_{17}))$.

FIG. 20A

Further Decoder implementation details:

The above table is implemented as follows.

Several variables are defined and used to generate, (l1 l2 l3 l4 l5 l6 l7 l8 r1 r2 r3 r4 r5 r6 r7 r8). These variables are:

```
m1 m2 m3 m4
n1 n2 n3 n4
w0m w1m w2m w3m w4m
wn
g1 g2 g3 g4
G
K(1) K(2) K(3) K(4) K(5) K(6) K(7) K(8)
H1 s1 s2 s3 s4 s5 s6 s7 s8 s9 s10
111 121 131 141 151 161 171 181
112 122 132 142 152 162 172 182
113 123 133 143 153 163 173 183
i1 i2 i3
v1 v2 v3 v4 v5 v6
H5 H6
z1 z2 z3 z4 z5 z6
```

The above variables are defined at the end of this section. The following table describes when each variable can be generated.

| Variable | Generate |
|---|---|
| m1 m2 m3 m4<br>n1 n2 n3 n4<br>w0m w1m w2m w3m w4m<br>wn<br>g1 g2 g3 g4<br>G<br>K(1) K(2) K(3) K(4) K(5) K(6) K(7) K(8)<br>H1 s1 s2 s3 s4 s5 s6 s7 s8 s9 s10 | After c1-c8 |
| 111 121 131 141 151 161 171 181<br>112 122 132 142 152 162 172 182<br>113 123 133 143 153 163 173 183 | After c9-c10 |
| l1 l2 l3 l4 l5 l6 l7 l8 | After c11 |
| i1 i2 i3<br>v1 v2 v3 v4 v5 v6<br>H5 H6<br>z1 z2 z3 z4 z5 z6<br>r1 r2 r3 r4 r5 r6 r7 r8 | After c12-c17 |

FIG. 20B

```
After c1-c8:
m1=c1; m2=c2; m3=c3; m4=c4;
n1=c5; n2=c6; n3=c7; n4=c8;

w0m= ~(m1|m2|m3|m4);
w1m=((m1)&(~m2)&(~m3)&(~m4))|((~m1)&(m2)&(~m3)&(~m4))|((~m1)&(~m2)&(m3)&(~m4))|((~m1)&(~m2)&(~m3)&(m4));
w3m=((m1)&(m2)&(m3)&(~m4))|((m1)&(m2)&(~m3)&(m4))|((m1)&(~m2)&(m3)&(m4))|((~m1)&(m2)&(m3)&(m4));
w4m= m1&m2&m3&m4;
w2m= ~(w0m|w1m|w3m|w4m);

wn=(~(n1|n2|n3|n4)) | (n1)&(~n2)&(~n3)&(~n4)|(~n1)&(n2)&(~n3)&(~n4)|(~n1)&(~n2)&(n3)&(~n4)|(~n1)&(~n2)&(~n3)&(n4));

g1=m1&(~n1);
g2=m2&(~n2);
g3=m3&(~n3);
g4=m4&(~n4);

G = g1|((~(xor(m1,n1))) & (g2|((~(xor(m2,n2)) & (g3|((~(xor(m3, n3)) & g4 )))));

```
After c9 c10:

After c11:
l1=111|(112&c11)|(113&(~c11));
l2=121|(122*c11)|(123&(~c11));
l3=131|(132*c11)|(133&(~c11));
l4=141|(142*c11)|(143&(~c11));
l5=151|(152*c11)|(153&(~c11));
l6=161|(162*c11)|(163&(~c11));
l7=171|(172*c11)|(173&(~c11));
l8=181|(182*c11)|(183&(~c11));

FIG. 20E

After c12-c17:

```
i1= xor((~c13),c14)&(~xor((~c13),c15))&(~xor((~c13),c16))&(~xor((~c13),c17));
i2= xor((~c13),c14)&( xor((~c13),c15)  |  xor((~c13),c17));
i3=(~xor((~c13),c14));

v1= i1 | (xor((~c13),c15) & i3);
v2=      (xor((~c13),c15)      & i2);
v3=      (xor((~c13),c16) & i3);
v4=      (xor((~c13),c16) & i2);
v5= i1 | (xor((~c13),c17) & i3);
v6=      (xor((~c13),c17) & i2);

H5= xor(c15 , ((~c14)&(~c15)&( c16)&( c17))|((  c14)&( c15)&(~c16)&(~c17))  );
H6= xor(c16 , ((~c14)&(~c15)&( c16)&( c17))|((  c14)&( c15)&(~c16)&(~c17))  );

MULTIPROPERTY 16/17 TRELLIS CODE

A compact disc is included herewith and incorporated by reference herein having thereon a computer program listing appendix in the ASCII uncompressed text format with ASCII carriage return, ASCII line feed and all control codes defined in ASCII, having computer compatibility with IBM PC/XT/AT or compatibles, having operating system compatibility with MS-Windows and including files source_code_1617_H'.txt and source_code_1617_H".txt of 13,747 bytes and 10,462 bytes, respectively, both created on Sep. 25, 2002.

BACKGROUND OF THE INVENTION

1. Field of the Invention

The present invention is directed to a rate 16/17 coding system for encoding or decoding data while minimizing propagation of any errors introduced after the encoding and before the decoding and while assuring certain bit properties of words encoded by the coding system.

2. Description of the Related Art

To minimize errors introduced during the conveyance of data, and to assure certain bit properties of the data when it is in encoded form for conveyance, systems often encode data before it is filtered or conveyed between two points. Encoding typically involves transforming the data and introducing additional information to the data, where the additional information can be used to recover from or minimize the effect of discrepancies that can be introduced during conveyance.

A coding scheme (or code) may be measured by two opposing qualities. A first quality of a coding scheme is the efficiency or rate of the code, which is the amount of input data to be encoded, in proportion to the amount of the input data plus added coding information. For example, if a code adds one coding bit to a 16-bit input word, thus producing a 17-bit codeword, then the rate of the code is 16/17. A high coding rate naturally leads to an efficient rate of conveying the input data, because less total information must be conveyed per unit of input data that is conveyed. A second quality of a coding scheme is the degree to which the added coding information facilitates recovery from or minimization of errors introduced during conveyance. There is a tension between these two coding qualities. Higher error recovery rates (desirable) generally require less efficient coding rates (undesirable). More efficient coding rates (desirable) generally lead to lower error recovery rates (undesirable). Furthermore, Low error recovery or high error propagation can also require a more complex outer error correction code. What is needed is a coding scheme with a low error propagation rate and an efficient coding rate that guarantees various benefits relating to the bit make-up of a codeword without requiring a complex outer error correction code.

SUMMARY OF THE INVENTION

It is an aspect of the present invention to provide a rate 16/17 coding system that exhibits various combinations of code properties. In a first embodiment of the rate 16/17 code, if a codeword H' is (H1' H2'), where H1' represents the first 8 bits of the H' codeword, and H2' represents the last 9 bits of the H' codeword, then:

1) each codeword H' has at least 7 bits with a value of 1;
2) H1' has at least 3 bits with a value of 1;
3) H2' has at least 3 bits with a value of 1;
4) H1' has at least 1 odd-coordinate bit with a value of 1, and at least 1 even-coordinate bit with a value of 1;
5) H2' has at least 1 odd-coordinate bit with a value of 1, and at least 1 even-coordinate bit has a value of 1; and
6) there are no more than 11 consecutive zeros in any sequence of one or more codewords, and there are no more than 7 consecutive alternating bits (every other bit) in the sequence that have a value of 0.

In a second embodiment of the rate 16/17 code, if a codeword H" is (H1" H2"), where H1" represents the first 11 bits of H", and H2" represents the last 6 bits of H", then:

1) each codeword H" has at least 7 bits with a value of 1;
2) H1" has at least 3 bits with a value of 1;
3) H2" has at least 2 bits with a value of 1;
4) H2" has at least 1 odd-coordinate bit with a value of 1, and at least 1 even-coordinate bit has a value of 1;
5) there are no more than 11 consecutive zeros in any sequence of one or more codewords, and there are no more than 10 consecutive alternating bits (every other bit) in the sequence that have a value of 0; and
6) Early Decoding Property (EDP)—H1" may be used alone (without H2") to recover from its codeword the first byte (8 bits) of un-encoded data corresponding to the codeword of H2".

These, together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 4 shows tables 200 and 202, which describe the partition 120 of the input space or domain of the H' encoder 124.

FIGS. 5–9 show the maps 122 (F1, F2, F3E, F3O, F4) used for the H' encoder 124.

FIGS. 5–9 also show the inverse maps 132 (F1I, F2I, F3EI, F3OI, F4I) F301, F41) used for the H' decoder 134.

FIG. 10 shows a table 270 and details 272 describing the H' encoder 124.

FIG. 11 shows a table 280 and details 282 describing the H' decoder 134.

FIG. 14 shows tables 340 and 342, which describe the partition 320 of the input space or domain of the H" encoder 324.

FIGS. 15–18 show the maps 322 (F1, F2, F3) used for the H" encoder 324.

FIGS. 15–18 also show the inverse maps 332 (F1I, F2I, F3I) used for the H" decoder 134.

FIG. 19 shows a table 350 and details 352 describing the H" encoder 324.

FIG. 20A shows a table 360 and details 362 describing the H" decoder 334.

FIGS. 20B–20F provide further details of the H" decoder 334.

DETAILED DESCRIPTION OF THE PREFERRED EMBODIMENTS

Overview of System Using 16/17 Code

Figure 1:
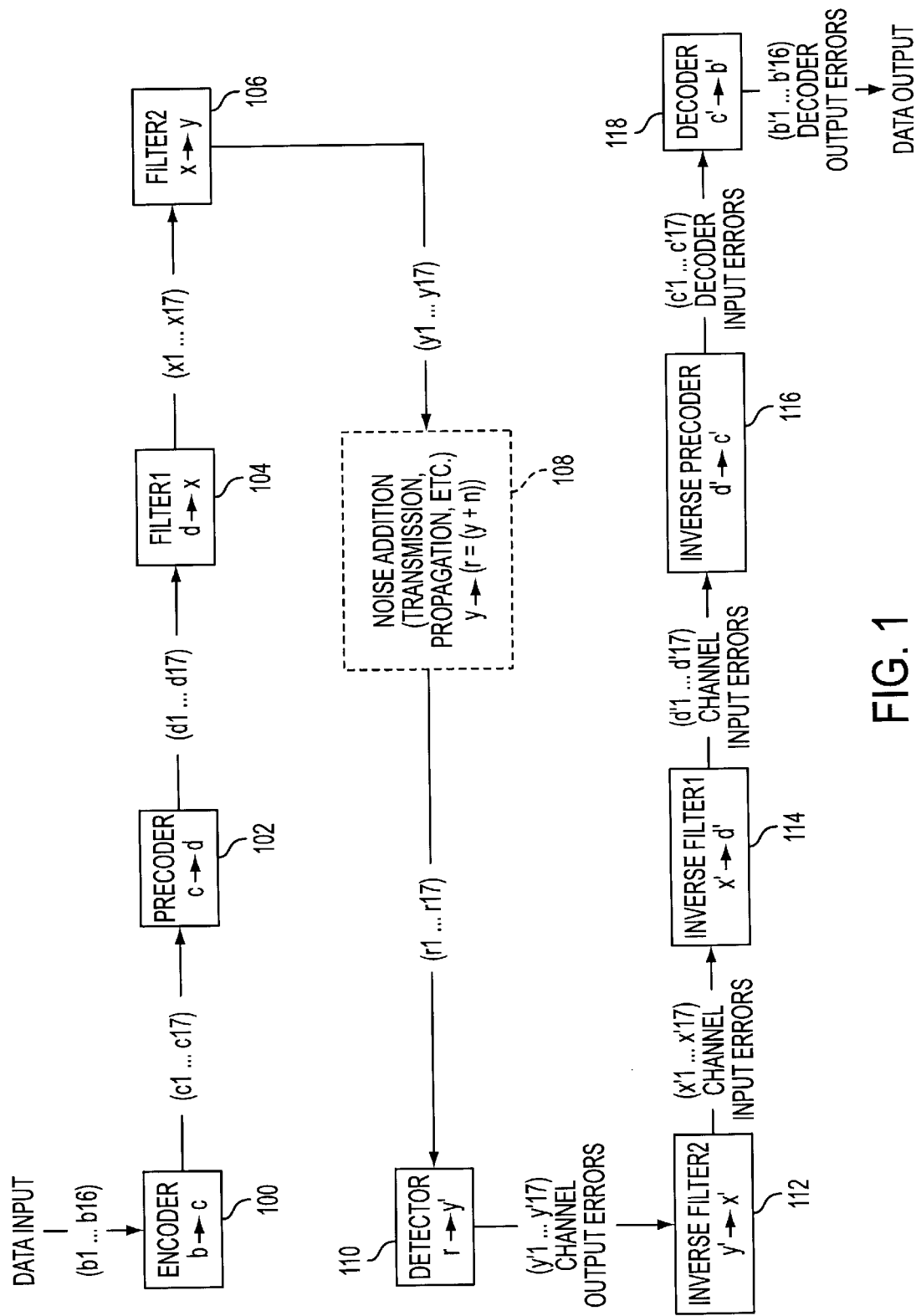
FIG. 1 shows a system for using the 16/17 codes of the present invention.

FIG. 1 shows a system for using the 16/17 codes of the present invention. The encoding or pre-conveying half of the system in FIG. 1 may be summarized as: b→c→d→x→y, where b is encoded to c, c is precoded to d, and d is filtered to x, and x is filtered to y. Not all stages are necessarily parts of the code or are required for its operation. An encoder 100 receives 16 bits of input data (b1 . . . b16), where (b1 . . . b16) denotes a vector or word of 16 bits. The code and its properties are also valid if the input data has been error-correction coded before being received by the encoder 100. The encoder 100 encodes the input data b, and outputs 17 bits of encoded data (c1 . . . c17). As discussed later, the encoding is based in part on states of the precoder 102. The precoder 102 receives the encoded output (c1 . . . c17) of the encoder 100, and performs an exclusive-or (XOR) state transformation on the sequence (c1 . . . 17) to produce an output sequence (d1 . . . d17). A first channel filter 104 receives the sequence (d1 . . . d17), performs another state transformation based on the sequence (d1 . . . d17), and outputs resulting sequence (x1 . . . x17). A second channel filter 106 receives the sequence (x1 . . . x17), performs another state transformation based on the sequence (x1 . . . x17), and outputs resulting sequence (y1 . . . y17). Note, these x and y vectors are not related to the x and y vectors used to describe the F* mapping functions (discussed later) used by the H' and H" codes.

The data y is then subjected to potential noise at a conveyance stage 108. The conveyance stage 108 may randomly perturb the symbols in sequence (y1 . . . y17), thus producing sequence (r1 . . . r17). For each symbol y(i) in word (y1 . . . y17), there is some probability (usually random) that the conveyance stage 108 will perturb y(i) with noise error n(i). The result of the conveyance received by Viterbi detector 110 can be denoted as vector addition (y1 . . . y17)+(n1 . . . n17)=(r1 . . . r17), or symbol addition r(i)=y(i)+r(i). The sequence (r1 . . . r17) is often called the received sequence.

The post-conveying or decoding half of the system in FIG. 1 may be summarized as: r→y'→x'→d'→c'→b', where r is Viterbi-detected to y', y' is filtered to x', x' is filtered to d', d' is inverse precoded to c', and c' is decoded to b'.

The detector 110 receives the possibly perturbed sequence (r1 . . . r17) and produces (y'1 . . . y'17), which is a reconstruction of (y1 . . . y17) with possibly one or more bits in error or perturbed. When any recovered symbol y'(i) is in error, i.e. when y'(i)≠y(i), a channel output error event has occurred. Channel output error events are typically attributable to noise n.

A second inverse channel filter 112 (corresponding to second channel filter 106) receives y' and inverse-filters (y'1 . . . y'17) to (x'1 . . . x'17). A first inverse channel filter 114 (corresponding to first channel filter 104) receives x' and inverse-filters (x'1 . . . x'17) to (d'1 . . . d'17).

A inverse precoder 116 receives d' and transforms (d'1 . . . d'17) to (c'1 . . . c'17) by performing the inverse of the precoder 102. When a recovered bit of d', say d'(j) differs from its corresponding original bit d(j), a channel input error event is said to have occurred.

A decoder 118 receives (c'1 . . . c'17), applies an inverse mapping of the coder 100, and outputs a reproduction b'=(b'1 . . . b'16) of the input data b=(b1 . . . b16), where some reproduced or decoded bits in b' may be in error. That is to say, for some original bits b(i) and corresponding reproduced bits b'(i), it is possible that b'(i)≠b(i). Such errors in the reproduced data b' are generally propagations of one or more errors received in c' (either in corresponding or nearby codewords), and are referred to hereafter as decoder output errors.

Although shown as separate units, the functionality of the detector 110, the second inverse channel filter 112, the first inverse channel filter 114, and the inverse precoder 116 may have various arrangements. For example, the Viterbi detector 110 may be constructed to include the functionality of either or both inverse channel filters 112/114. The detector 110 may also be constructed to include the inverse precoder 116.

There are two 16/17 code embodiments discussed below. The first is referred to as the H' code, and the second is referred to as the H" code.

Interaction Between Encoder and Precoder

The encoder 100 is followed by a $1/(1 \oplus D^2)$ precoder 102 having at time, i, a state s(i)=(s2(i),s1(i)), an input, c(i), and an output x(i), where x(i)=c(i)⊕s2(i). The state, s, is updated for time i+1 as follows:

s(i+1)=(s2(i+1),s1(i+1)), where s2(i+1)=s1(i), and s1(i+1)=x(i).

The output of the precoder 102 passes through a cascade of channel filters 104,106 denoted by $(1-D^2)$ and $(a+bD+cD^2)$. At the output of the filters 104,106, y bits are corrupted by additive noise n(r(i)=y(i)+n(i)). The term $1-D^2$ has input d and outputs x, and its output at time i is x(i)=d(i)−d(i-2). The term $a+bD+cD^2$ has input x and output y, where the output at time i is y(i)=a*x(i)+b*x(i-1)+c*x(i-2).

Discussion of Error Events and Code Properties

An aspect of the present invention is that typical long channel errors are prevented With coding systems in general, it is desirable that (i) the length of typical channel errors be short, (ii) the decoder does not propagate short channel errors into long decoder errors, and (iii) the number of non-zero values over a codeword be large.

If conditions (i) and (ii) are not satisfied then the system may require a more powerful (outer) error correction coding of the input data b. This will increase the complexity of the system. Regarding condition (iii), the non-zero values are useful because they provide useful information for recovering the system clock, and more non-zero values lead to a more accurate system clock.

With respect to condition (i), a long typical channel error may occur when, for some pair of integers k and M (M large), and for x*ϵ{−1,1}:

(x(k+1),x(k+2), . . . , x(k+M))=x*(1−1−1 1−1 . . . ), or (x(k+2*1),x(k+2*2), . . . , x(k+2M))=x*(1 1 1 1 1 1 . . . ).

As mentioned above, there are two 16/17 code embodiments discussed herein; the H' code and the H" code. For discussion, codewords of the H' code are divided into a H1' part and a H2' part (an H' code word is H1' concatenated with H2'). Similarly, codewords of the H" code are a concatenation of H1" with H2".

Property (4) of H1', mentioned in the SUMMARY requires that there be at least one nonzero even-coordinate and at least one nonzero odd coordinate over the H1' portion of the H' code. Property (4) of H1' is guaranteed for code H', but is not guaranteed for code H". Similarly, both the H' and the H" code guarantee that there will be at least one nonzero even-coordinate bit and at least one nonzero odd-coordinate bit over the H2' and H2" portions of the codes (see the SUMMARY for property (5) of H2' and property (4) of H2"). The nonzero odd/even-coordinate properties contribute to condition (i), and Properties (1)–(3) of both the H' code and the H" code advance condition (iii). Furthermore, since codewords are 17 bits long, the decoder cannot propagate a channel error more than 16 bits. Therefore, codes, H' and H", also satisfy condition (ii). Finally, let 16 bits, (D1, D2), be encoded to (H1", H2"), where D1 and D2 each are 8 bits. The Early Decoding Property (EDP) requires that D1 be decodable based on H1" alone. The EDP helps condition (ii) for the H" code, but not for the H' code.

How the H' and H" Codes are Explained

In FIG. 1, the encoder 100 is shown as mapping b to c, and the decoder 118 is shown as mapping c' to b'. However, FIGS. 2–20F and the following discussion describe the H' and H" embodiments of encoder 100 and decoder 118 independently of FIG. 1. The H' and H" encoders are described generically in terms of mapping between a vector x and a vector y. In the case of the H' code, FIGS. 2, 3, 10 and 11 describe H' in terms of x=(x1 ... x16) and y=(y1 ... y17). In the case of the H" code, FIGS. 12, 13, and 20A–20F describe H" in terms of x=(I1 ... I8 r1 ... r8), and y=(c1 ... c17).

In the context of FIG. 1, the input b of the encoder 100 will correspond to the input x of the H' or the H" encoder, and the output c of the encoder 100 will correspond to the output y of either the H' or the H" encoder. A similar explanation applies to the decoder 118 and the H' and H" decoder embodiments. To understand the following discussion, it is helpful to keep in mind that the scope of some variables used to describe the various mappings may be local.

The H' Encoder and Decoder

Figure 2:
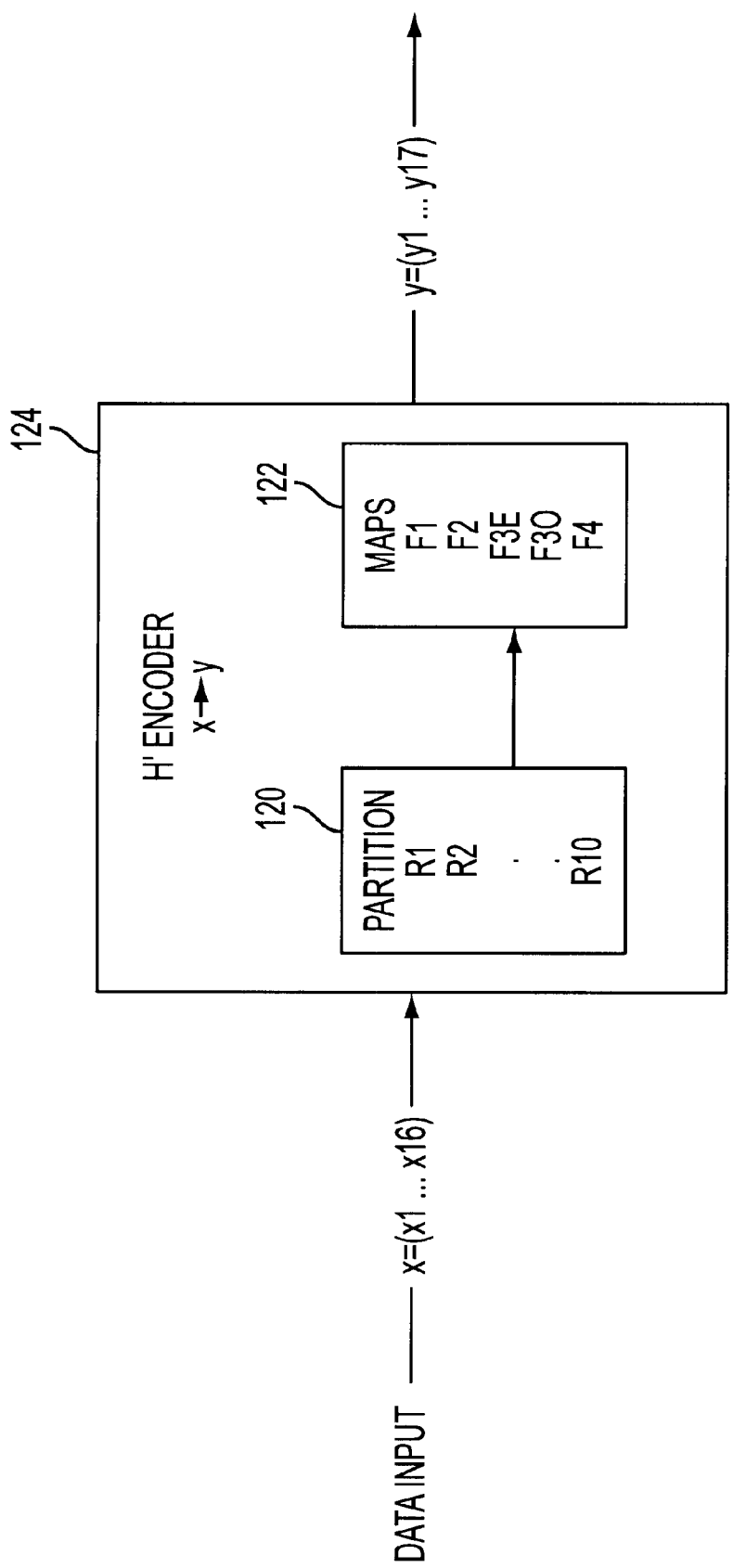
FIG. 2 shows a partition 120 and maps 122 for the H' encoder 124 embodiment of encoder 100.

FIG. 2 shows a partition 120 and maps 122 for the H' encoder 124 embodiment of encoder 100. The H' encoder 124 maps 16-bit input words x to 17-bit codewords y. The H' encoder 124 uses the partition 120 to determine how to map x to y, where the mapping so determined may involve one of the maps 122.

Figure 3:
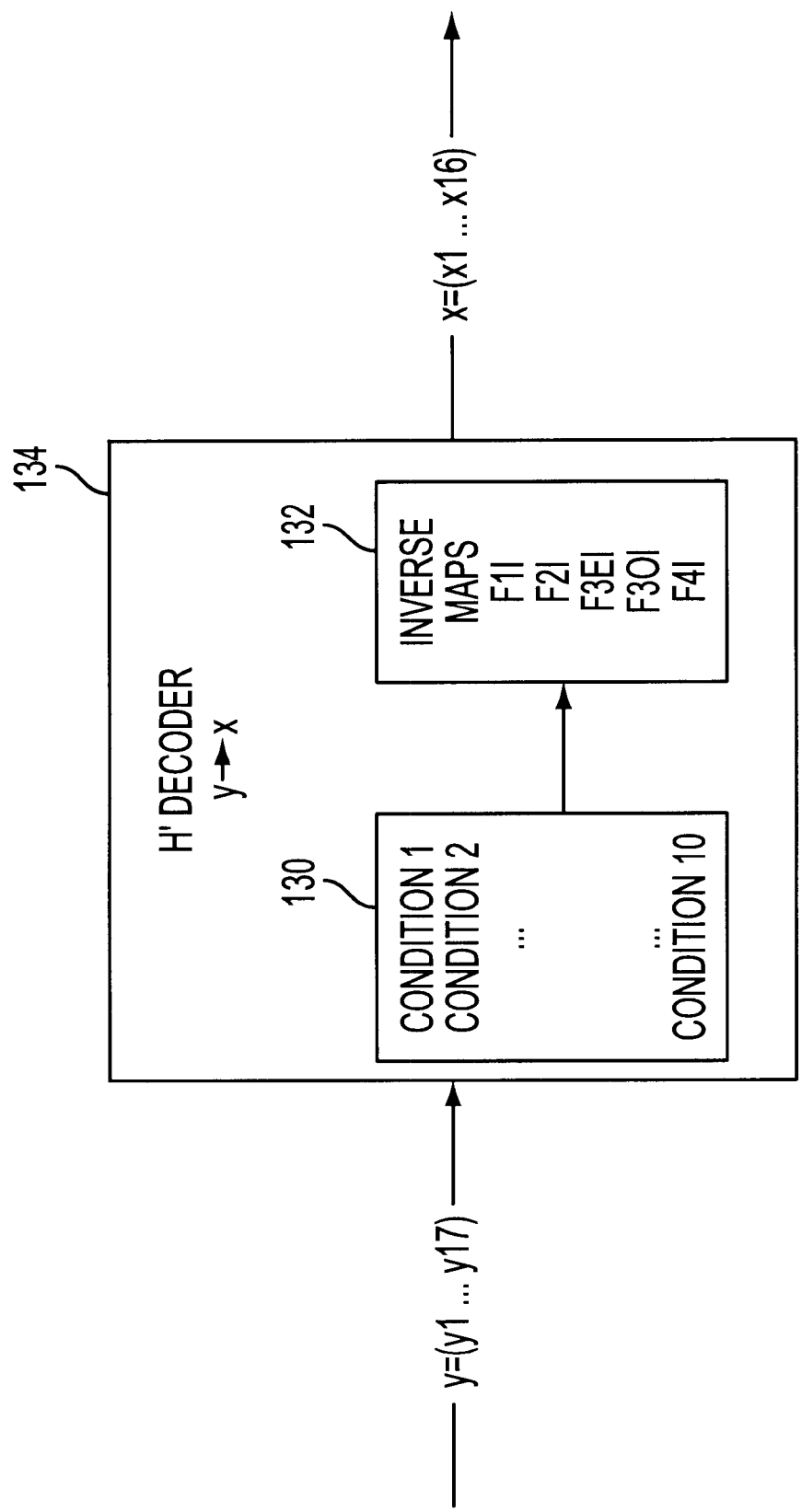
FIG. 3 shows conditions 130 and inverse maps 132 for the H' decoder 134 embodiment of decoder 118.
Figure 5:
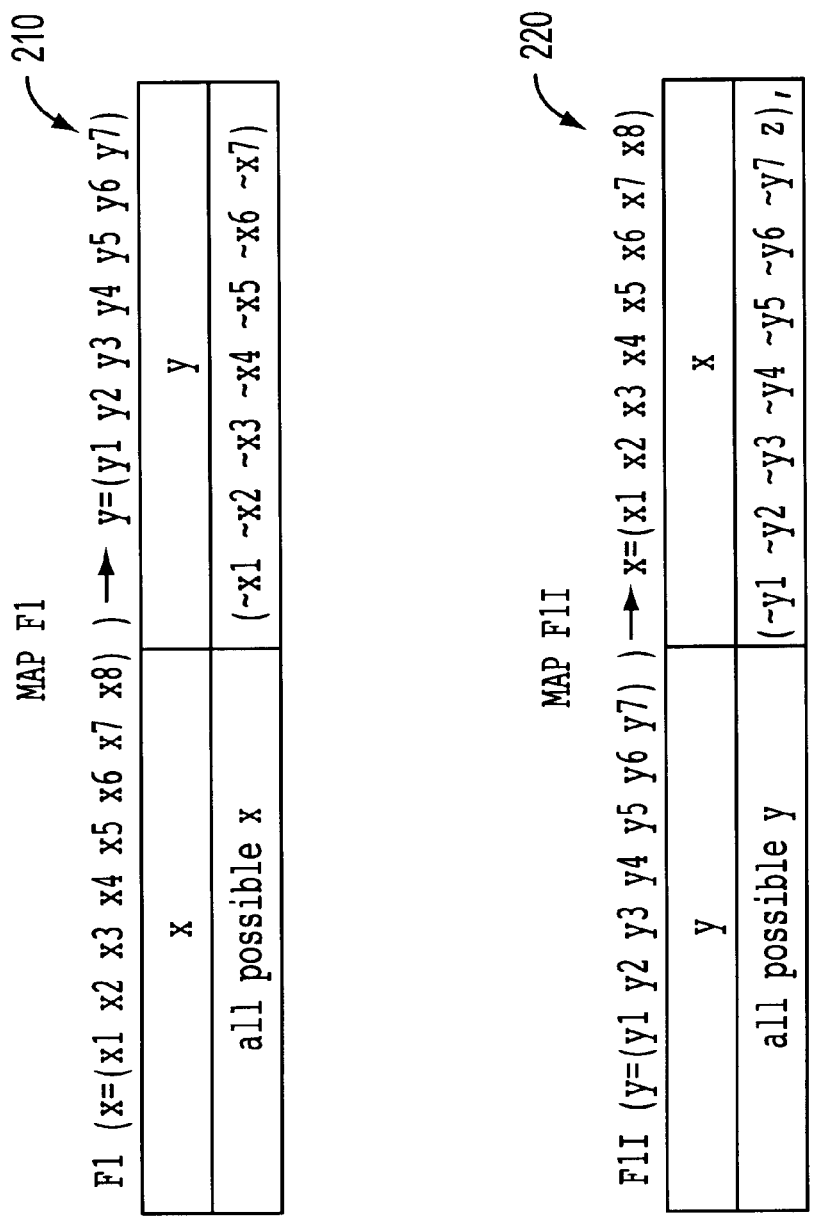
Figure 8:
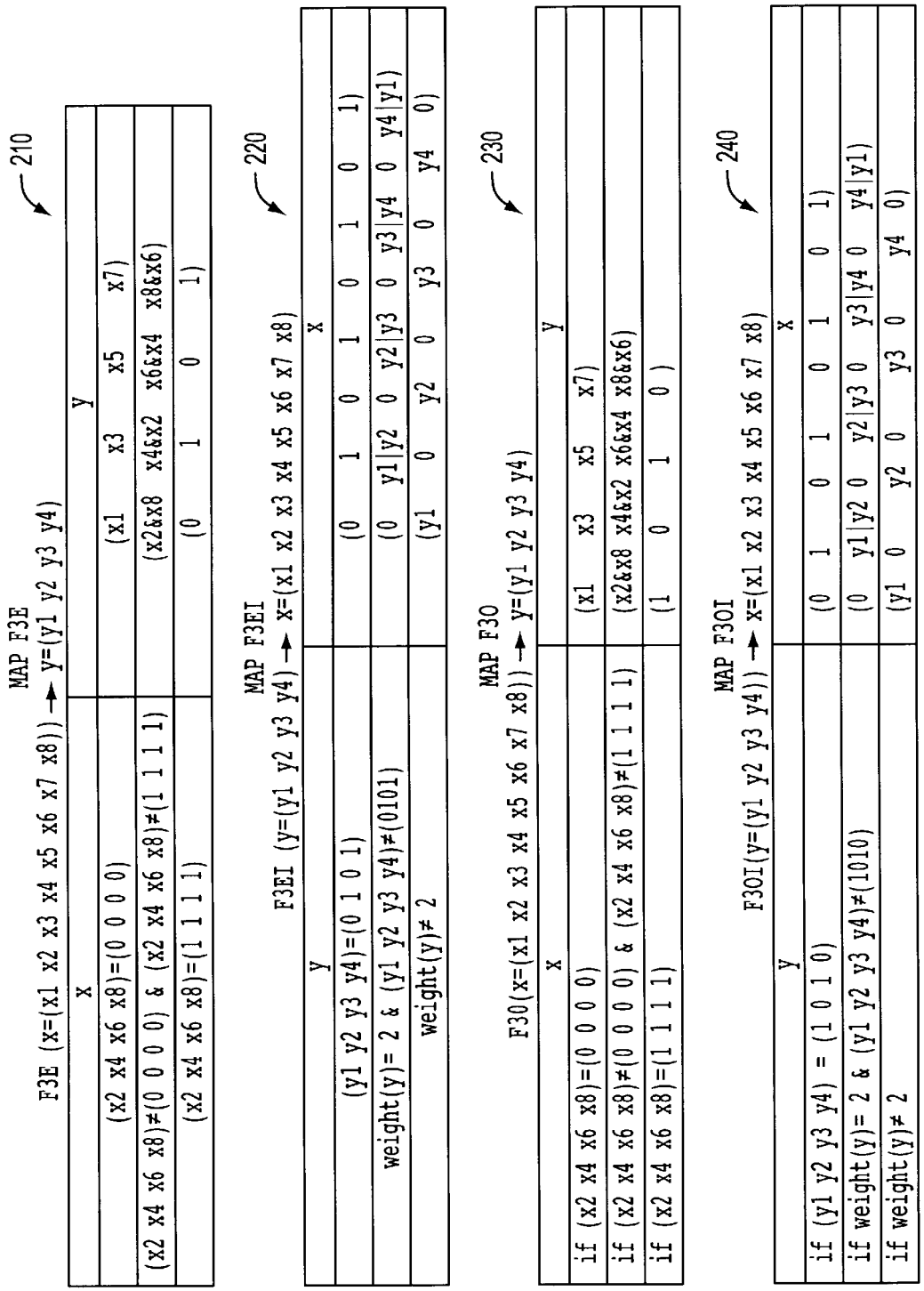

FIG. 3 shows conditions 130 and inverse maps 132 for the H' decoder 134 embodiment of decoder 118. The H' decoder 134 maps 17-bit codewords x to 16-bit output words y. The H' decoder 134 uses the conditions 130 to determine how to map y to x, where the mapping so determined may involve one of the inverse maps 132.

FIG. 4 shows tables 200 and 202, which describe the partition 120 of the input space or domain of the H' encoder 124. FIGS. 5–9 show the maps 122 (F1, F2, F3E, F3O, F4) used for the H' encoder 124. FIGS. 5–9 also show the inverse maps 132 (F1I, F2I, F3EI, F3OI, F4I) used for the H' decoder 134. For example, F1I is the inverse of F1.

FIG. 10 shows a table 270 and details 272 describing the H' encoder 124. For a particular input x of H' encoder 124, x will be in one of the partitions R1–R10, and x will be mapped to y as described in the corresponding row in table 270. Details 272 further explain how the bits y1 to y17 are determined. For example, if a particular x falls into set R6, then x will map to y as shown in row 6 of table 270. In this example, (y3 ... y8) in row 6 correspond to (h1" ... h6") in details 272. Details 272 show that the (h1" ... h6")=(y3 ... y8) portion of y will be determined by map F2.

FIG. 11 shows a table 280 and details 282 describing the H' decoder 134. For a particular input y of H' decoder 134, one of the conditions in the second column of table 280 will hold true for y, and y will be mapped to x as described in the corresponding row in table 280. Details 282 further explain how the bits x1 to x16 are determined. For example, if a particular y satisfies (y17=1 & y1y2y3y4=0010), then the condition in row 2 is met, and y will map to x as shown in row 2 of table 280. In this example, (x1 ... x8) in row 2 correspond to (A1' ... A8') in details 282. Details 282 show that the (A1' ... A8')=(x1 ... x8) portion of x will be determined by inverse map F3EI.

The H" Encoder and Decoder

Figure 12:
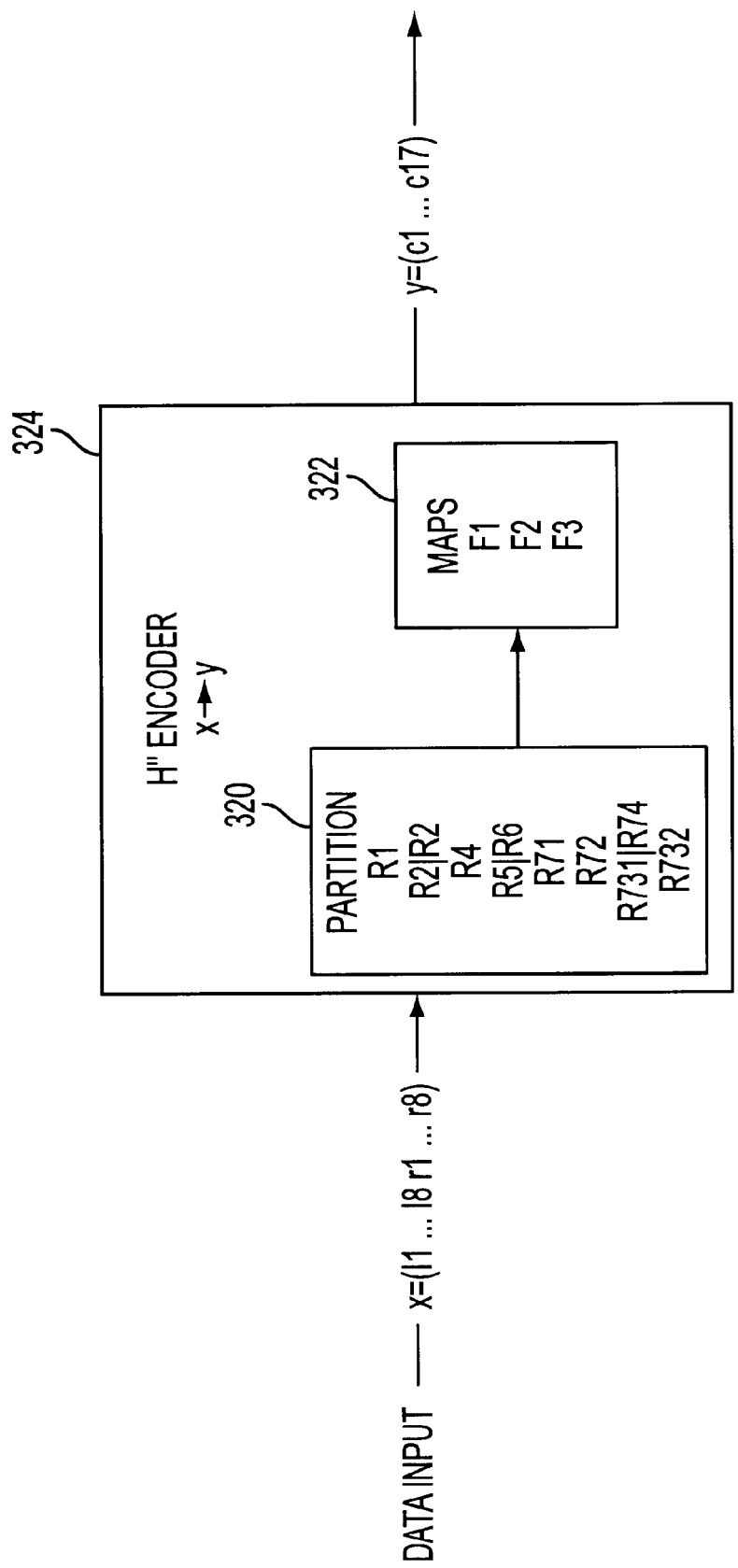
FIG. 12 shows a partition 320 and maps 322 for the H" encoder 324 embodiment of encoder 100.

FIG. 12 shows a partition 320 and maps 322 for the H" encoder 324 embodiment of encoder 100. The H" encoder 324 maps 16-bit input words x to 17-bit codewords y. The H" encoder 324 uses the partition 320 to determine how to map x to y, where the mapping so determined may involve one or more of the maps 322.

Figure 13:
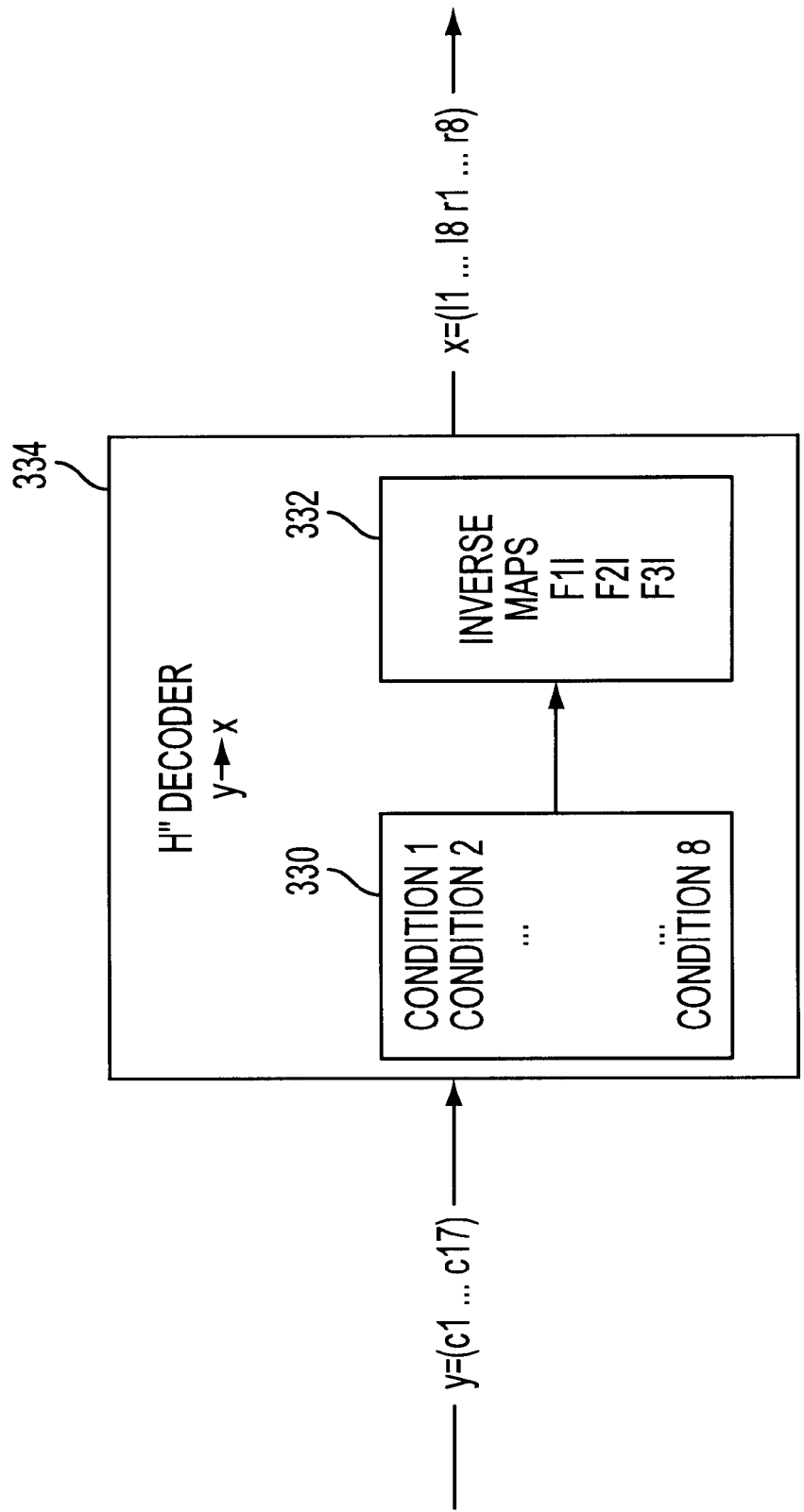
FIG. 13 shows conditions 330 and inverse maps 332 for the H" decoder 334 embodiment of encoder 118.

FIG. 13 shows conditions 330 and inverse maps 332 for the H" decoder 334 embodiment of encoder 118. The H" decoder 334 maps 17-bit codewords x to 16-bit output words y. The H" decoder 334 uses the conditions 330 to determine how to map y to x, where the mapping so determined may involve one of the inverse maps 332.

FIG. 14 shows tables 340 and 342, which describe the partition 320 of the input space or domain of the H" encoder 324. FIGS. 15–18 show the maps 322 (F1, F2, F3) used for the H" encoder 324. FIGS. 15–18 also show the inverse maps 332 (F1I, F2I, F3I) used for the H" decoder 134.

FIG. 19 shows a table 350 and details 352 describing the H" encoder 324. For a particular input x of H" encoder 324, x will be in one of the partitions 330 ("if x is in", 2d col.), and x will be mapped to y as described in the corresponding row in table 350. Details 352 further explain how the bits c1 to c17 are determined. For example, if a particular x falls into set R4, then x will map to y as shown in row 3 of table 350. In this example, part of y (c1 ... c8) in row 1 corresponds to (P1 P2 P3 P4 Q1 Q2 Q3 Q4) in details 352. Details 352 shows that the (P1 P2 P3 P4 Q1 Q2 Q3 Q4)=(c1 ... c8) portion of y will be determined by map F2 as applied to the first 10 bits of x (I1 ... I8 r1 r2).

FIG. 20A shows a table 360 and details 362 describing the H" decoder 334. For a particular input y of H" decoder 334, one of the conditions in the second column ("If") of table 360 will hold true for y, and y will be mapped to x as described in the corresponding row in table 360. Details 362 further explain how the bits (I1 ... I8 r1 ... r8) of x are determined. For example, if the second condition in table 360 is satisfied, then the condition in row 2 is met, and y will map to x as shown in row 2 of table 360. FIGS. 20B–20F provide further details of the H" decoder 334.

It is noted that the tables, details, etc. shown in the figures are used only for describing the H' and H" codes. Actual embodiments or implementations of the codes do not require tables per se (although they may be used). The described codes may be formed with circuitry, software, etc., all of which may implement the mathematical concepts of the codes.

CONCLUSION

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An apparatus, comprising:
a coding system capable of encoding 16-bit input words into even parity 17-bit codewords, wherein the codewords have at least 7 ones, wherein the codewords comprise an 8-bit first half and a 9-bit second half, wherein the first half comprises at least 3 or more ones, and wherein the second half comprises at least 3 or more ones.

2. An apparatus according to claim 1, wherein the first half and second half of the codewords each comprise odd-coordinate bits and even-coordinate bits, and wherein at least one odd-coordinate bit of each half has a value of one, and at least one even-coordinate bit of each half has a value of one.

3. An apparatus according to claim 1, wherein any sequence of one or more codewords has at most 11 consecutive bits with a value of zero.

4. An apparatus according to claim 1, wherein for any subsequence of alternating bits in the sequence, the subsequence has at most 7 consecutive bits with a zero value.

5. An apparatus, comprising:
a coding system capable of encoding 16-bit input words into even parity 17-bit codewords, wherein the codewords have at least 7 ones, wherein the codewords comprise an 11-bit first half and a 6-bit second half, wherein the first half comprises at least 3 or more ones, and wherein the second half comprises at least 2 or more ones.

6. An apparatus according to claim 5, wherein the second half of the codewords comprise odd-coordinate bits and even-coordinate bits, and wherein at least one odd-coordinate bit of the second half has a value of one, and at least one even-coordinate bit of the second half has a value of one.

7. An apparatus according to claim 5, wherein any sequence of one or more codewords has at most 11 consecutive bits with a value of zero.

8. An apparatus according to claim 5, wherein for any subsequence of alternating bits in the sequence, the subsequence has at most 10 consecutive bits with a zero value.

9. An apparatus according to claim 5, wherein the first 8 bits of the input words are capable of being decoded based only on the first half of the codeword.

10. An apparatus, comprising:
a coding means for coding 16-bit words into 17-bit codewords; and
a filter receiving at least one of the 17-bit codewords and words based on the 17-bit codewords.

11. An apparatus according to claim 10, wherein the coding means comprises mapping means for mapping a portion of the 16-bit words to a portion of the 17-bit codewords.

12. An apparatus, comprising:
a detector outputting 17-bit codewords; and
a decoding means for outputting 16-bit words by decoding at least one of the 17-bit codewords and words based on the 17-bit codewords.

13. An apparatus according to claim 12, wherein the decoding means comprises a mapping means for mapping a portion of the 17-bit codewords to a portion of the 16-bit words.

14. A method, comprising:
encoding 16-bit input words into even parity 17-bit codewords, wherein the codewords have at least 7 ones, wherein the codewords comprise an 8-bit first half and a 9-bit second half, wherein the first half comprises at least 3 or more ones, and wherein the second half comprises at least 3 or more ones.

15. A method according to claim 14, wherein the first half and second half of the codewords each comprise odd-coordinate bits and even-coordinate bits, and wherein at least one odd-coordinate bit of each half has a value of one, and at least one even-coordinate bit of each half has a value of one.

16. A method according to claim 14, wherein any sequence of one or more codewords has at most 11 consecutive bits with a value of zero.

17. A method according to claim 14, wherein for any subsequence of alternating bits in the sequence, the subsequence has at most 7 consecutive bits with a zero value.

18. A method, comprising:
encoding 16-bit input words into even parity 17-bit codewords, wherein the codewords have at least 7 ones, wherein the codewords comprise an 11-bit first half and a 6-bit second half, wherein the first half comprises at least 3 or more ones, and wherein the second half comprises at least 2 or more ones.

19. A method according to claim 18, wherein the second half of the codewords comprise odd-coordinate bits and even-coordinate bits, and wherein at least one odd-coordinate bit of the second half has a value of one, and at least one even-coordinate bit of the second half has a value of one.

20. A method according to claim 18, wherein any sequence of one or more codewords has at most 11 consecutive bits with a value of zero.

21. A method according to claim 18, wherein for any subsequence of alternating bits in the sequence, the subsequence has at most 10 consecutive bits with a zero value.

22. A method according to claim 18, wherein the first 8 bits of the input words are capable of being decoded based only on the first half of the codeword.

23. A computer-readable storage allowing a computer to perform a process, the process, comprising:
encoding 16-bit input words into even parity 17-bit codewords, wherein the codewords have at least 7 ones, wherein the codewords comprise an 8-bit first half and a 9-bit second half, wherein the first half comprises at least 3 or more ones, and wherein the second half comprises at least 3 or more ones.

24. A computer-readable storage according to claim 23, wherein the first half and second half of the codewords each comprise odd-coordinate bits and even-coordinate bits, and wherein at least one odd-coordinate bit of each half has a value of one, and at least one even-coordinate bit of each half has a value of one.

25. A computer-readable storage according to claim 23, wherein any sequence of one or more codewords has at most 11 consecutive bits with a value of zero.

26. A computer-readable storage according to claim 23, wherein for any subsequence of alternating bits in the sequence, the subsequence has at most 7 consecutive bits with a zero value.

27. A computer-readable storage allowing a computer to perform a process, the process, comprising:
encoding 16-bit input words into even parity 17-bit codewords, wherein the codewords have at least 7 ones, wherein the codewords comprise an 11-bit first half and a 6-bit second half, wherein the first half comprises at least 3 or more ones, and wherein the second half comprises at least 2 or more ones.

28. A computer-readable storage according to claim 27, wherein the second half of the codewords comprise odd-coordinate bits and even-coordinate bits, and wherein at least one odd-coordinate bit of the second half has a value of one, and at least one even-coordinate bit of the second half has a value of one.

29. A computer-readable storage according to claim 27, wherein any sequence of one or more codewords has at most 11 consecutive bits with a value of zero.

30. A computer-readable storage according to claim 27, wherein for any subsequence of alternating bits in the sequence, the subsequence has at most 10 consecutive bits with a zero value.

31. A computer-readable storage according to claim 27, wherein the first 8 bits of the input words are capable of being decoded based only on the first half of the codeword.

* * * * *